United States Patent [19]
Arai

[11] Patent Number: 5,852,584
[45] Date of Patent: Dec. 22, 1998

[54] DYNAMIC RANDOM ACCESS MEMORY OF A PLURALITY OF BANKS EXHIBITING HIGH SPEED ACTIVATION OPERATION OF SENSE AMPLIFIER

[75] Inventor: Minari Arai, Tokyo, Japan

[73] Assignee: NEC Corporation, Tokyo, Japan

[21] Appl. No.: 907,948

[22] Filed: Aug. 11, 1997

[30] Foreign Application Priority Data

Aug. 9, 1996 [JP] Japan ..................................... 8-211018

[51] Int. Cl.⁶ .................................................. G11C 8/00
[52] U.S. Cl. .............................. 365/230.03; 365/230.06; 365/205
[58] Field of Search ........................ 365/63, 205, 230.03, 365/230.06, 207, 190

[56] References Cited

U.S. PATENT DOCUMENTS

| | | | |
|---|---|---|---|
| 5,267,214 | 11/1993 | Jujishima et al. | 365/230.03 |
| 5,493,535 | 2/1996 | Cho | 365/230.03 |
| 5,506,810 | 4/1996 | Runnas | 365/230.03 |
| 5,568,431 | 10/1996 | Rao | 365/230.03 |
| 5,586,078 | 12/1996 | Takase et al. | 365/230.03 |
| 5,617,363 | 4/1997 | Yumitori et al. | 365/230.03 |
| 5,671,188 | 9/1997 | Patel et al. | 365/205 |

Primary Examiner—David Nelms
Assistant Examiner—Tuan T. Nguyen
Attorney, Agent, or Firm—Foley & Lardner

[57] ABSTRACT

The present invention also provides a dynamic random access memory device comprising a plurality of banks. Each of the banks includes a plurality of memory cell arrays. Each of the memory cell arrays is connected to a row address decoder and a sense amplifier which is connected to a sense amplifier driver circuit for supplying a sense amplifier activation signal to the sense amplifier so as to activate the sense amplifier. It is important that a pair of the sense amplifiers respectively provided in adjacent two banks has a connection control circuit which is capable of providing an electrical connection between the paired sense amplifiers respectively provided in the adjacent two banks. The connection control circuit operates to make the paired sense amplifiers electrically conductive to each other so that charges are supplied from first one of the paired sense amplifiers through the connection control circuit to second one of the paired sense amplifiers whereby the second one of the paired sense amplifiers is activated not only by the sense amplifier driver circuit but also with the charges supplied through the connection control circuit from the first one of the paired sense amplifiers, provided that the connection control circuit connects the pair of the sense amplifiers when the bank having the first one of the paired sense amplifiers has been previously selected and the bank having the second one of the paired sense amplifiers is currently selected.

12 Claims, 7 Drawing Sheets

DYNAMIC RANDOM ACCESS MEMORY OF A PLURALITY OF BANKS EXHIBITING HIGH SPEED ACTIVATION OPERATION OF SENSE AMPLIFIER

BACKGROUND OF THE INVENTION

The present invention relates to a semiconductor memory device, and more particularly to a dynamic random access memory comprising a plurality of banks exhibiting high speed activation operations of sense amplifiers.

It has been known in the art that the dynamic random access memory device may comprise a plurality of banks. Data read out operations of the dynamic random access memory device comprising a plurality of banks are made by selecting any one of the banks, wherein the selected bank shows the same read out operation as the normal disc random access memory device whilst non-selected bank keeps the past activated state of the sense amplifier.

FIG. 1 is a block diagram illustrative of a conventional dynamic random access memory device comprising two banks. The conventional dynamic random access memory device comprises first and second banks BANK0 and BANK1. The first bank BANK0 has a plurality of memory cell arrays 00, 01 and 02 which are aligned in a direction parallel to bit lines. A row decoder 11 is provided which is connected with word lines of the memory cell array 00 for selecting one of the word lines. A sense amplifier 05 is provided which is connected with bit lines of the memory cell array 00 for amplifying bit line signals on the bit lines. A sense amplifier driver circuit 03 is provided which is connected to the sense amplifier 05 through sense amplifier activation signal lines 07 and 08 for driving the sense amplifier 05. A row decoder 12 is provided which is connected with word lines of the memory cell array 01 for selecting one of the word lines. A sense amplifier 06 is provided which is connected with bit lines of the memory cell array 01 for amplifying bit line signals on the bit lines. A sense amplifier driver circuit 04 is provided which is connected to the sense amplifier 06 through sense amplifier activation signal lines 09 and 10 for driving the sense amplifier 06. A row decoder 13 is provided which is connected with word lines of the memory cell array 02 for selecting one of the word lines. A column decoder 14 is provided which is connected with bit lines of the memory cell array 02 for selecting one of the bit lines.

The second bank BANK1 has a plurality of memory cell arrays 100, 101 and 102 winch are aligned in a direction parallel to bit lines. A row decoder 111 is provided which is connected with word lines of the memory cell array 100 for selecting one of the word lines. A sense amplifier 105 is provided which is connected with bit lines of the memory cell array 100 for amplifying bit line signals on the bit lines. A sense amplifier driver circuit 103 is provided which is connected to the sense amplifier 105 through sense amplifier activation signal lines 107 and 108 for driving the sense amplifier 105. A row decoder 112 is provided which is connected with word lines of the memory cell array 101 for selecting one of the word lines. A sense amplifier 106 is provided which is connected with bit lines of the memory cell array 101 for amplifying bit line signals on the bit lines. A sense amplifier driver circuit 104 is provided which is connected to the sense amplifier 106 through sense amplifier activation signal lines 109 and 110 for driving the sense amplifier 106. A row decoder 113 is provided which is connected with word lines of the memory cell array 102 for selecting one of the word lines 116. A column decoder 114 is provided which is connected with bit lines of the memory cell array 102 for selecting one of the bit lines.

Read out operations of the above conventional dynamic random access memory device will be described with reference to FIG. 2 which is a diagram illustrative of waveforms of signals transmitted for reading out data from the conventional dynamic random access memory device comprising a plurality of the banks. It is assumed that the first bank BANK0 is selected for reading out data from selected memory cells in the selected first bank BANK0, whilst the second bank BANK1 is non-selected. For the read out operations, row address strobes are activated to fetch a row address which is then decoded by the row decoders to select any one of the word lines. The sense amplifiers 05 and 06 are activated to fetch data of the memory cells onto the bit lines whereby the memory device enters into the read-enable state. Thereafter, a column address strobe (CASB) is activated to fetch a column address which will then be decoded by the column decoder 14 to select any one of the bit lines for read out operations of the data on the bit lines.

The following descriptions focus on the data read out operations where data are read out from memory cells on a different word line from the previously selected word line. The row address strobe already activated is first inactivated for placing the sense amplifier into the inactivation state so as to have the memory operations stable. Thereafter, the row address strobe (RASB) is activated to fetch a different row address from the above previously fetched row address so as to select different one of the word lines from the above previously selected word line. Subsequently, the sense amplifiers 05 and 06 are again activated for read out operations of the data on the bit lines.

On the other hand, the non-selected second bank "BANK1" holds previously-activated states of the sense amplifiers 105 and 106 which have fetched memory cell data onto the bit lines. Even if the currently selected bank operates to select a different word line from the previously selected word line, the sense amplifiers 105 and 106 have still currently been kept in the previously activated states.

As described above, the read out operation of the selected bank in the dynamic random access memory device is made in the same manner as the normal dynamic random access memory device, for which reason in order to select a different word line from the previously selected word line, the activated sense amplifiers have been once inactivated and then the inactivated sense amplifiers are required to be again activated. Namely, resensing operations are required to be made. The previous sensing operation has already been finished and the memory has been entered into the read-enable state, of which reason operation for reading out the data on the same word line may In made at high speed. In contrast, in order to select the different word line from the previously selected word line, the above resensing sensing operations of the sense amplifier are required wherein the previously activated sense amplifier has been once inactivated for having the circuit stable before the inactivated sense amplifier is then re-activated again, for which reason it is difficult to carry out the required high speed data-read operations In the above circumstances, it had been required to develop a novel or improved dynamic random access memory of a plurality of banks which is, however, capable of high speed data read operations not only when the same word line as the previously selected word line is intended to be selected but also when a different word line from the previously selected word line is intended to be selected.

SUMMARY OF THE INVENTION

Accordingly, it is an object of the present invention to provide a novel dynamic random access memory of a plurality of banks which is, however, free from the problems as described above.

It is a further object of the present invention to provide a novel dynamic random access memory of a plurality of banks which is, however, capable of high speed data read operations not only when the same word line as the preciously selected word line is intended to be selected but also when a different word line from the previously selected word line is intended to be selected.

The above and other objects, features and advantages of the present invention will be apparent from the following descriptions.

The present invention also provides a dynamic random access memory device comprising a plurality of banks. Each of the banks includes a plurality of memory cell arrays. Each of the memory cell arrays is connected to a row address decoder and a sense amplifier which is connected to a sense amplifier driver circuit for supplying a sense amplifier activation signal to the sense amplifier so as to activate the sense amplifier. It is important that a pair of the sense amplifiers respectively provided in adjacent two banks has a connection control circuit which is capable of providing al electrical connection between the paired sense amplifiers respectively provided in the adjacent two banks. The connection control circuit operates to make the paired sense amplifiers electrically conductive to each other so that charges are supplied from first one of the paired sense amplifiers through the connection control circuit to second one of the paired sense amplifiers whereby the second one of the paired sense amplifiers is activated not only by the sense amplifier driver circuit but also with the charges supplied through the connection control circuit from the first one of the paired sense amplifiers, provided that the connection control circuit connects the pair of the sense amplifiers when the bank having the first one of the paired sense amplifiers has been previously selected and the bank having the second one of the paired sense amplifiers is currently selected.

BRIEF DESCRIPTIONS OF THE DRAWINGS

Preferred embodiments according to the present invention will be described with reference to the accompanying drawings.

DISCLOSURE OF THE INVENTION

Figure 1:
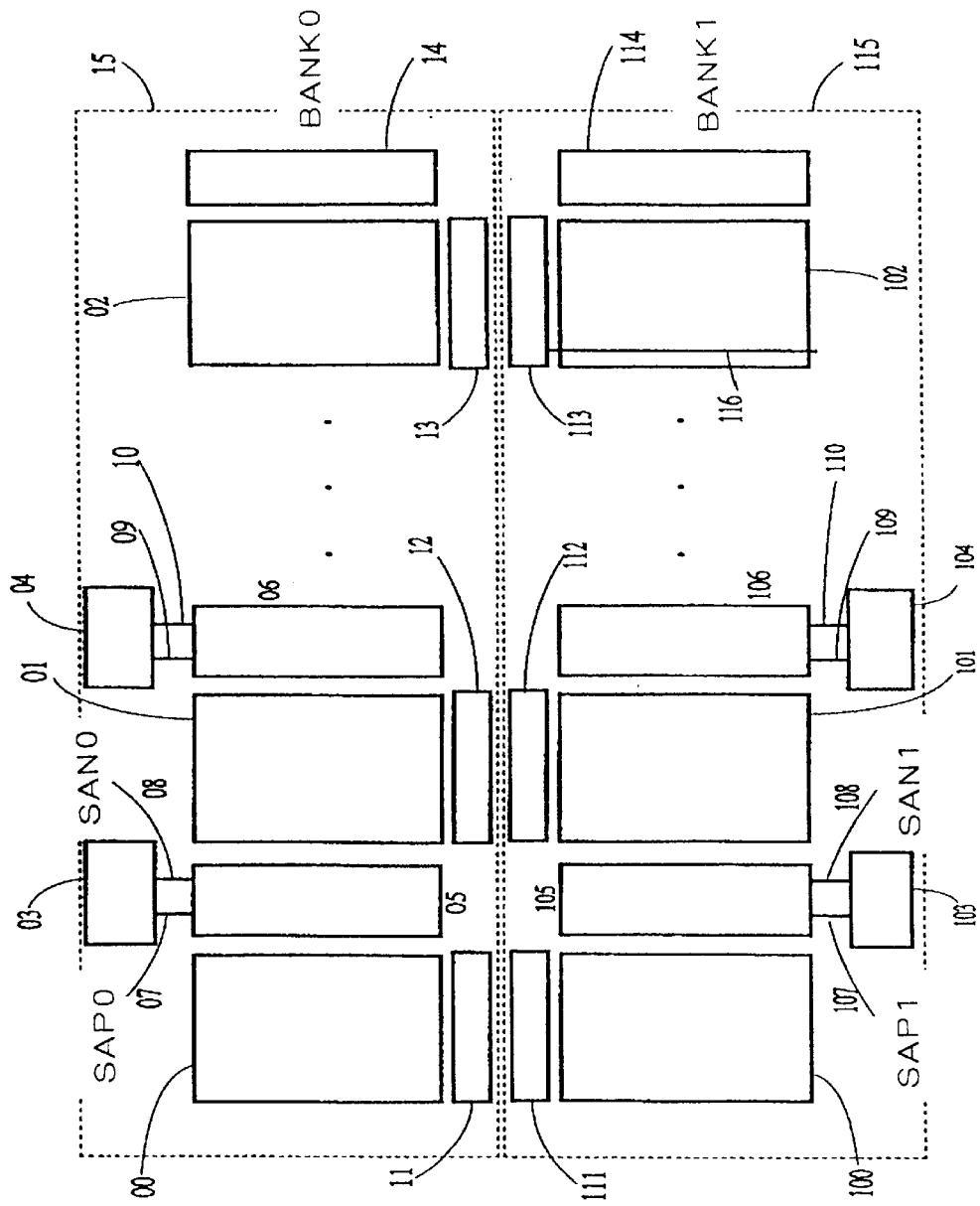
FIG. 1 is a block diagram illustrative of the conventional dynamic random access memory device comprising two banks.
Figure 2:
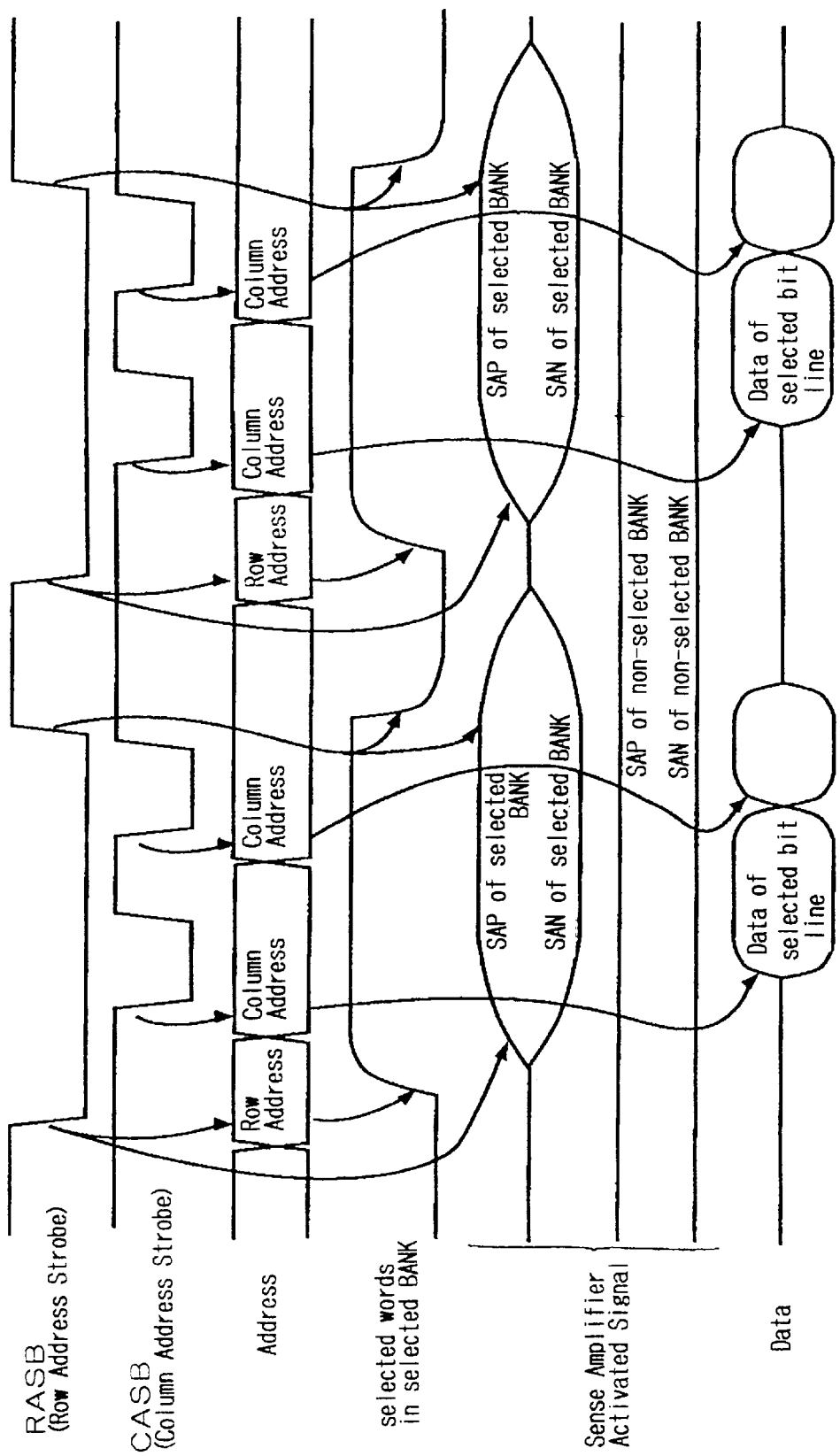
FIG. 2 is a diagram illustrative of waveforms of signals transmitted for reading out data from the conventional dynamic random access memory device comprising two banks of FIG. 1.

The present invention provides a connection control circuit for providing an electrical connection between a pair of sense amplifiers respectively provided in adjacent two banks in a dynamic random access memory device having a plurality of the banks. Each of the sense amplifiers is connected to a sense amplifier driver circuit for supplying a sense amplifier activation signal to the sense amplifier so as to activate the sense amplifier. The connection control circuit operates to make the paired sense amplifiers electrically conductive to each other so that charges are supplied from first one of the paired sense amplifiers through the connection control circuit to second one of the paired sense amplifiers whereby the second one of the paired sense amplifiers is activated not only by the sense amplifier driver circuit but also with the charges supplied through the connection control circuit from the first one of the paired sense amplifiers, provided that the connection control circuit connects the pair of the sense amplifiers when the bank having the first one of the paired sense amplifiers has been previously selected and the bank having the second one of the paired sense amplifiers is currently selected.

Preferably, the first one of the sense amplifiers is connected to first one of the sense amplifier driver circuits through first and second sense amplifier activation signal lines which transmit first and second sense amplifier activation signals respectively. The second one of the sense amplifiers is connected to second one of the sense amplifier driver circuits through third and fourth sense amplifier activation signal lines which transmit third and fourth sense amplifier activation signals respectively The connection control circuit may comprise first and second switching circuits. The first switching circuit is capable of connecting the first and third sense amplifier activation signal lines. The first switching circuit is connected to a first connection control signal line for receiving a first connection control signal having been transmitted on the first connection control signal line so that the first switching circuit operates to connect the first and third sense amplifier activation signal lines in accordance with the first connection control signal. The second switching circuit is capable of connecting the second and fourth sense amplifier activation signal lines. The second switching circuit is connected to a second connection control signal line for receiving a second connection control signal having been transmitted on the second connection control signal line so that the second switching circuit operates to connect the second and fourth sense amplifier activation signal lines in accordance with the second connection control signal.

More preferably, the first switching circuit may comprise a first conductivity type channel field effect transistor connected in series between the first and third sense amplifier activation signal lines. The first conductivity type channel field effect transistor has a gate electrode connected to the first connection control signal line. The second switching circuit may also comprise a second conductivity type channel field effect transistor connected in series between the second and fourth sense amplifier activation signal lines. The second conductivity type channel field effect transistor has a gate electrode connected to the second connection control signal line, provided that the second connection control signal being transmitting on the second connection control signal line is an inversion signal to the first connection control signal being transmitting on the first connection control signal line.

Alternatively, it is also preferable that the first switching circuit may comprise first, second and third field effect transistors of a first conductivity type channel. The first and second field effect transistors are connected in series between the first and third sense amplifier activation signal lines. The first and second field effect transistors have gate electrodes commonly connected to the first connection control signal line. The third field effect transistor is connected in series between a ground line and a first node positioned between the first and second field effect transistors. The third field effect transistor has a gate electrode connected to the first connection control signal line. The second switching circuit may also comprises fourth fifth and sixth field effect transistors of a second conductivity type channel. The fourth and fifth field effect transistors are connected in series between the second and fourth sense amplifier activation signal lines. The fourth and fifth field effect transistors have gate electrodes commonly connected to the second connection control signal line. The sixth field effect transistor is connected in series between a high voltage line and a second node positioned between the fourth and fifth field effect transistors. The sixth field effect transistor has a gate electrode connected to the second connection control signal line, provided that the second connection control signal being transmitting on the second connection control signal line is an inversion signal to the first connection control signal being transmitting on the first connection control signal line.

It is available that the first and second control signals are kept to be applied to the first and second switching circuits during when any one of the banks is kept in a sense amplifier activation state where it is possible to activate the sense amplifiers.

It is also available that the first and second control signals are one-shot signals applied to the first and second switching circuits in a moment of the time-duration when any one of the banks is kept in a sense amplifier activation state where it is possible to activate the sense amplifiers.

The present invention also provides a dynamic random access memory device comprising a plurality of banks. Each of the banks includes a plurality of memory cell arrays. Each of the memory cell arrays is connected to a row address decoder and a sense amplifier which is connected to a sense amplifier driver circuit for supplying a sense amplifier activation signal to the sense amplifier so as to activate the sense amplifier. It is important that a pair of the sense amplifiers respectively provided in adjacent two banks has a connection control circuit which is capable of providing an electrical connection between the paired sense amplifiers respectively provided in the adjacent two banks. The connection control circuit operates to make the paired sense amplifiers electrically conductive to each other so that charges are supplied from first one of the paired sense amplifiers through the connection control circuit to second one of the paired sense amplifiers whereby the second one of the paired sense amplifiers is activated not only by the sense amplifier driver circuit but also with the charges supplied through the connection control circuit from the first one of the paired sense amplifiers, provided that the connection control circuit connects the pair of the sense amplifiers when the bank having the first one of the paired sense amplifiers has been previously selected and the bank having the second one of the paired sense amplifiers is currently selected.

Preferably, the first one of the sense amplifiers is connected to first one of the sense amplifier driver circuits through first and second sense amplifier activation signal lines which transmit first and second sense amplifier activation signals respectively. The second one of the sense amplifiers is connected to second one of the sense amplifier driver circuits through third and fourth sense amplifier activation signal lines which transmit third and fourth sense amplifier activation signals respectively. The connection control circuit may comprise first and second switching circuits. The first switching circuit is capable of connecting the first and third sense amplifier activation signal lines. The first switching circuit is connected to a first connection control signal line for receiving a first connection control signal having been transmitted on the first connection control signal line so that the first switching circuit operates to connect the first and third sense amplifier activation signal lines in accordance with the first connection control signal. The second switching circuit is capable of connecting the second and fourth sense amplifier activation signal lines. The second switching circuit is connected to a second connection control signal line for receiving a second connection control signal having been transmitted on the second connection control signal line so that the second switching circuit operates to connect the second and fourth sense amplifier activation signal lines in accordance with the second connection control signal.

More preferably, the first switching circuit may comprise a first conductivity type channel field effect transistor connected in series between the first and third sense amplifier activation signal lines. The first conductivity type channel field effect transistor has a gate electrode connected to the first connection control signal line. The second switching circuit may also comprise a second conductivity type channel field effect transistor connected in series between the second and fourth sense amplifier activation signal lines. The second conductivity type channel field effect transistor has a gate electrode connected to the second connection control signal line, provided that the second connection control signal being transmitting on tie second connection control signal line is an inversion signal to the first connection control signal being transmitting on the first connection control signal line.

Alternatively, it, is also preferable that the first switching circuit may comprise first, second and third field effect transistors of a first conductivity type channel. The first and second field effect transistors are connected in series between the first and third sense amplifier activation signal lines. The first and second field effect transistors have gate electrodes commonly connected to the first connection control signal line. The third field effect transistor is connected in series between a ground line and a first node positioned between the first and second field effect transistors. The third field effect transistor has a gate electrode connected to the first connection control signal line. The second switching circuit may also comprises fourth, fifth and sixth field effect transistors of a second conductivity type channel. The fourth and fifth field effect transistors are connected in series between the second and fourth sense amplifier activation signal lines. The fourth and fifth field effect transistors have gate electrodes commonly connected to the second connection control signal line. The sixth field effect transistor is connected in series between a high voltage line and a second node positioned between the fourth and fifth field effect transistors The sixth field effect transistor has a gate electrode connected to the second connection control signal line, provided that the second connection control signal being transmitting on the second connection control signal line is an inversion signal to the first connection control signal being transmitting on the first connection control signal line.

It is available that the first and second control signals are kept to be applied to the first and second switching circuits during when any one of the banks is kept in a sense amplifier activation state where it is possible to activate the sense amplifiers.

It is also available that the first and second control signals are one-shot signals applied to the first and second switching circuits in a moment of the time-duration when any one of the banks is kept in a sense amplifier activation state where it is possible to activate the sense amplifiers.

PREFERRED EMBODIMENT

Figure 3:
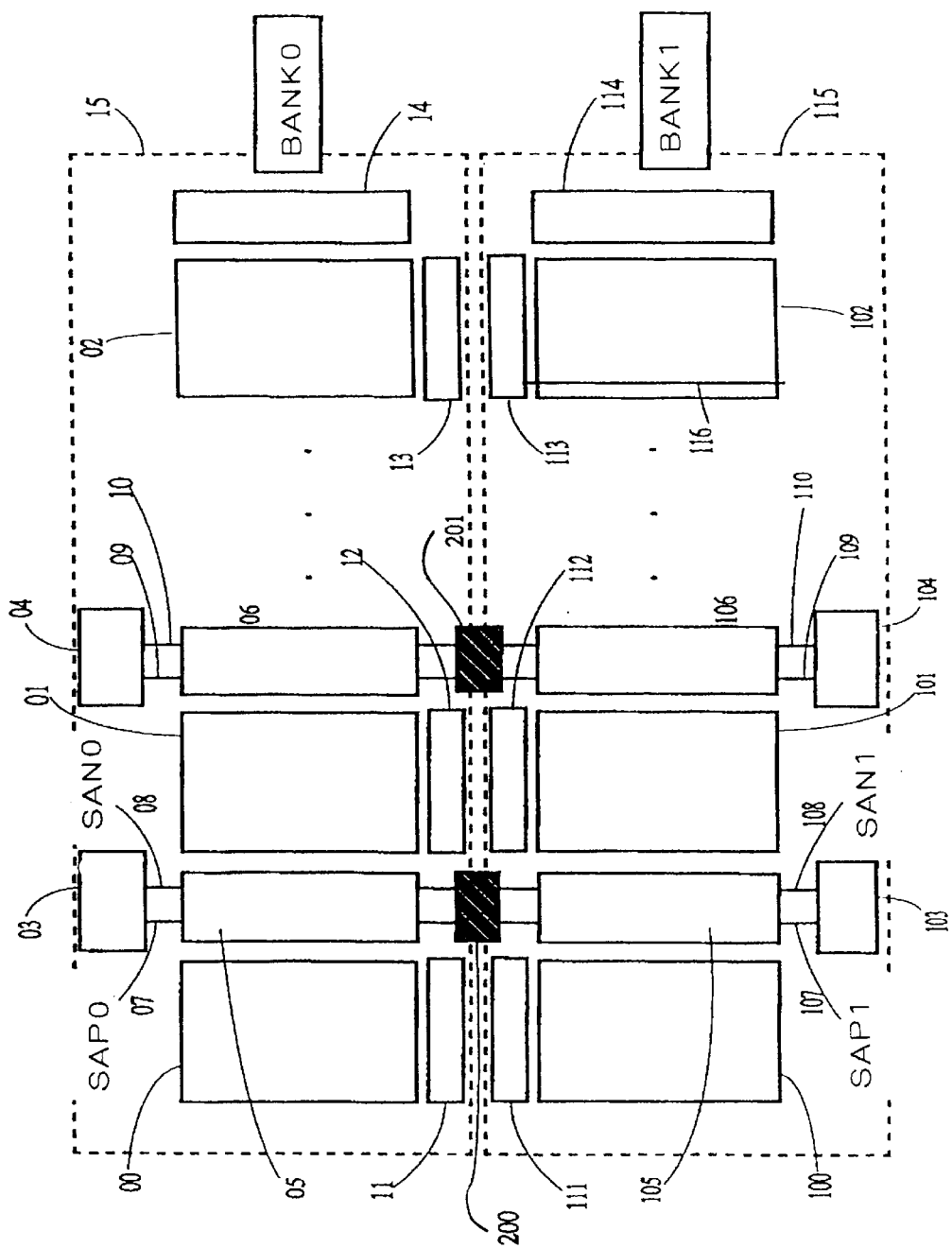
FIG. 3 is a block diagram illustrative of a novel dynamic random access memory device comprising two banks in a preferred embodiment according to the present invention.

A preferred embodiment according to the present invention will be described as follows. FIG. 3 is a block diagram illustrative of a novel dynamic random access memory device comprising two banks wherein a plurality of sense amplifier activation signal line connection control circuits are provided between sense amplifiers respectively provided in the two banks of the novel dynamic random access memory device. The novel dynamic random access memory device comprising two banks are provided with a plurality of sense amplifier activation signal line connection control circuits are provided between sense amplifiers respectively provided in the two banks so that the sense amplifier activation signal line connection control circuits are capable of high speed data read operations not only when the same word line as the previously selected word line is intended to be selected but also when a different word line from the previously selected word line is intended to be selected.

The circuit configuration of the novel dynamic random access memory device comprising two banks in accordance with the present invention will be described in detail with reference to FIG. 3. The novel dynamic random access memory device comprises first and second banks BANK0 and BANK1. The first bank BANK0 has a plurality of memory cell arrays 00, 01 and 02 which are aligned in a direction parallel to bit lines or a column direction. A row decoder 11 is provided which is connected with word lines of the memory cell array 00 for selecting one of the word lines. A sense amplifier 05 is provided which is connected with bit lines of the memory cell array 00 for amplifying bit line signals on the bit lines. A sense amplifier driver circuit 03 is provided which is connected to the sense amplifier 05 through sense amplifier activation signal lines 07 and 08 for driving the sense amplifier 05. A row decoder 12 is provided which is connected with word lines of the memory cell array 01 for selecting one of the word lines. A sense amplifier 06 is provided which is connected with bit lines of the memory cell array 01 for amplifying bit line signals on the bit lines. A sense amplifier driver circuit 04 is provided which is connected to the sense amplifier 06 through sense amplifier activation signal lines 09 and 10 for driving the sense amplifier 06. A row decoder 13 is provided which is connected with word lines of the memory cell array 02 for selecting one of the word lines. A column decoder 14 is provided which is connected with bit lines of the memory cell array 02 for selecting one of the bit lines.

The second bank BANK1 has a plurality of memory cell arrays 100, 101 and 102 which are aligned in a direction parallel to bit lines or a column direction. A row decoder 11 is provided which is connected with word lines of the memory cell array 100 for selecting one of the word lines. A sense amplifier 105 is provided which is connected with bit lines of the memory cell array 100 for amplifying bit line signals on the bit lines. A sense amplifier driver circuit 103 is provided which is connected to the sense amplifier 105 through sense amplifier activation signal lines 107 and 108 for driving the sense amplifier 105. A row decoder 112 is provided which is connected with word lines of the memory cell array 101 for selecting one of the word lines. A sense amplifier 106 is provided which is connected with bit lines of the memory cell array 101 for amplifying bit line signals on the bit lines. A sense amplifier driver circuit 104 is provided which is connected to the sense amplifier 106 through sense amplifier activation signal lines 109 and 110 for driving the sense amplifier 106. A row decoder 113 is provided which is connected with word lines of the memory cell array 102 for selecting one of the word lines 116. A column decoder 114 is provided which is connected with bit lines of the memory cell array 102 for selecting one of the bit lines.

In accordance with the present invention, a sense amplifier activation signal line connection control circuit 200 is provided between the sense amplifier 05 provided in the first bank BANK0 and the sense amplifier 105 provided in the second bank BANK1. Namely, the sense amplifier activation signal line connection control circuit 200 is connected through the sense amplifier activation signal lines to the sense amplifier 05 provided in the first bank BANK0 and also connected through the sense amplifier activation signal lines to the sense amplifier 105 provided in the second bank BANK1 so that the sense amplifier 05 provided in the first bank BANK0 and the sense amplifier 105 provided in the second bank BANK1 are connected through the sense amplifier activation signal line connection control circuit 200. A sense amplifier activation signal line connection control circuit 201 is provided between the sense amplifier 06 provided in the first bank BANK0 and the sense amplifier 106 provided in the second bank BANK1. Namely, the sense amplifier activation signal line connection control circuit 201 is connected through the sense amplifier activation signal lines to the sense amplifier 06 provided in the first bank BANK0 and also connected through the sense amplifier activation signal lines to the sense amplifier 106 provided in the second bank BANK1 so that the sense amplifier 06 provided in the first bank BANK0 and the sense amplifier 106 provided in the second bank BANK1 are connected through the sense amplifier activation signal line connection control circuit 201.

Read out operations of the above novel dynamic random access memory device will be described, assuming that the first bank BANK0 is selected for reading out data from selected memory cells in the selected first bank BANK0, whilst the second bank BANK1 is non-selected. For the read out operations, a row address strobe is activated to fetch a row address which is then decoded by the row decoders to select any one of the word lines. The sense amplifiers 05 and 06 are activated to fetch data of the memory cells onto the bit lines whereby the memory device enters into the read-enable stat. Thereafter, a column address strobe (CASB) is activated to fetch a column address which will then be decoded by the column decoder 14 to select any one of the bit lines for read out operations of the data on the bit lines.

The following descriptions focus on the data read out operations where data are read out from memory cells on a currently selected word line different from the previously selected word line. The non-selected second bank "BANK1" holds previously-activated states of the sense amplifiers 105 and 106 which have fetched memory cell data onto the bit lines. Even if the currently selected bank operates to select a different word line from the previously selected word line, the sense amplifiers 105 and 106 have still currently been kept in the previously activated states.

In order to read out data from memory cells on a currently selected word line different from the previously selected word line, the activated sense amplifier has been once inactivated and then the inactivated sense amplifier is required to be again activated. For example, the activation of the sense amplifier 05 in the currently selected bank BANK0 is made not only by driving the sense amplifier driver circuit 03 but also upon receipt of charges from the sense amplifier 105 in the previously selected bank BANK1. Namely, in order to activate the sense amplifier 05 in the currently selected bank BANK0, the sense amplifier activation signal line connection control circuit 200 makes the sense amplifier 05 in the currently selected bank BANK0 electrically conductive to the sense amplifier 105 in the previously selected bank BANK1 so that the charges acting as the sense amplifier activation signal is supplied from the sense amplifier 105 in the previously selected bank BANK1 through the sense amplifier activation signal lines 107 and 108, the sense amplifier activation signal line connection control circuit 200 and the sense amplifier activation signal lines 07 and 08 into the sense amplifier 05 in the currently selected bank BANK0. Upon receipt of the charges acting as the sense amplifier activation signal, the activation of the sense amplifier 05 in the currently selected bank BANK0 is promoted and accelerated so as to increase the activation speed. The sense amplifier 05 is activated to fetch data of the memory cells onto the bit lines whereby the memory device enters into the read-enable state. Thereafter, a column address strobe (CASB) is activated to fetch a column address which will then be decoded by the column decoder 14 to select any one of the bit lines for read out operations of the data on the bit lines.

The sense amplifier activation signal line connection control circuit 201 performs the same operations as the sense amplifier activation signal line connection control circuit 200. In order to read out data from memory cells on a currently selected word line different from the previously selected word line, the activated sense amplifier has been once inactivated and then tie inactivated sense amplifier is required to be again activated. For example, the activation of the sense amplifier 06 in the currently selected bank BANK0 is made not only by driving the sense amplifier driver circuit 04 but also upon receipt of charges from the sense amplifier 106 in the previously selected bank BANK1. Namely, in order to activate the sense amplifier 06 in the currently selected bank BANK0, the sense amplifier activation signal line connection control circuit 201 makes the sense amplifier 06 in the currently selected bank BANK0 electrically conductive to the sense amplifier 106 in the previously selected bank BANK1 so that the charges acting as the sense amplifier activation signal is supplied from the sense amplifier 106 in the previously selected bank BANK1 through the sense amplifier activation signal lines 109 and 110, the sense amplifier activation signal line connection control circuit 201 and the sense amplifier activation signal lines 09 and 10 into the sense amplifier 06 in the currently selected bank BANK0. Upon receipt of the charges acting as the sense amplifier activation signal, the activation of the sense amplifier 06 in the currently selected bank BANK0 is promoted and accelerated so as to increase the activation speed. The sense amplifier 05 is activated to fetch data of the memory cells onto the bit lines whereby the memory device enters into the read-enable state. Thereafter, a column address strobe (CASB) is activated to fetch a column address which will then be decoded by the column decoder 14 to select any one of the bit lines for read out operations of the data on the bit lines.

Figure 5:
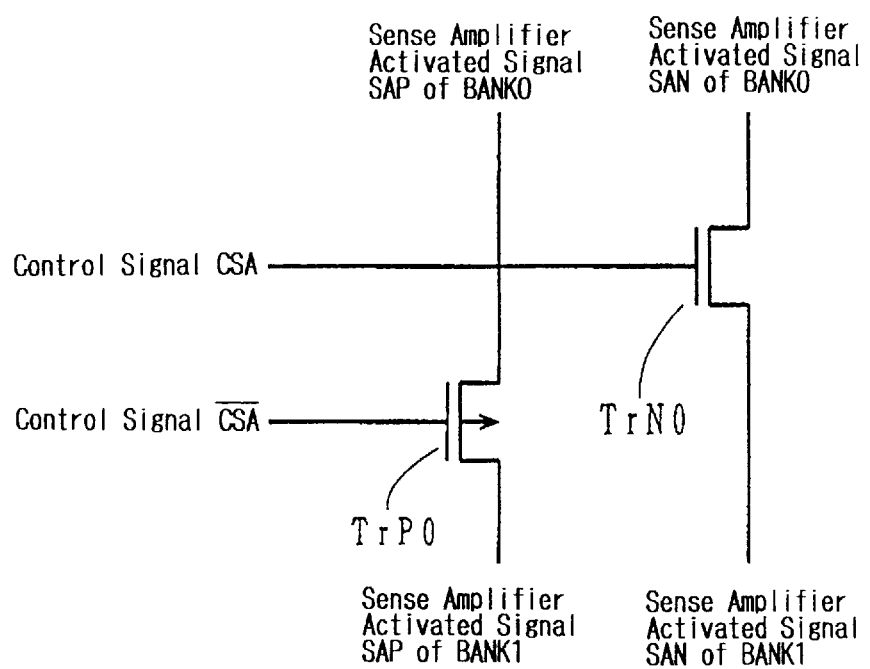
FIG. 5 is a circuit diagram illustrative of a sense amplifier activation signal line connection control circuit provided between sense amplifiers respectively provided in two banks of a novel dynamic random access memory device in a preferred embodiment according to the present invention.

FIG. 5 is a circuit diagram illustrative of each of the sense amplifier activation signal line connection control circuit 200. The sense amplifier activation signal line connection control circuit 201 has the same circuitry as the sense amplifier activation signal line connection control circuit 200. The sense amplifier activation signal line connection control circuit 200 comprises n-type and p-type MOS field effect transistors TrN0 and TrP0. The n-type MOS field effect transistor TrN0 is provided between the sense amplifier 05 in the first bank BANK0 and the sense amplifier 105 in the second bank BANK1. Namely, the n-type MOS field effect transistor TrN0 is connected in series through the sense amplifier activation signal line 08 to the sense amplifier 05 and also connected in series through the sense amplifier activation signal line 108 to the sense amplifier 105. The sense amplifier activation signal line 08 is provided for transmission of a sense amplifier activation signal SAN0 from the sense amplifier driver circuit 03 to the sense amplifier 05. The sense amplifier activation signal line 108 is provided for transmission of a sense amplifier activation signal SAN1 from the sense amplifier driver circuit 103 to the sense amplifier 105. A gate electrode of the n-type MOS field effect transistor TrN0 is connected to a first control signal line for receipt of a control signal CSA. When it is required to read out data from memory cells on a currently selected word line different from the previously selected word line, then the control signal CSA is set high level and applied to the gate electrode of the n-type MOS field effect transistor TrN0 whereby the n-type MOS field effect transistor TrN0 turns ON to make the sense amplifier 05 in the first bank BANK0 electrically conductive to the sense amplifier 105 in the second bank BANK1. As a result the charges are supplied from the sense amplifier 105 in the second bank BANK1 to the sense amplifier 05 in the first bank BANK0 to activate the sense amplifier 05 at high speed.

The p-type MOS field effect transistor TrP0 is provided between the sense amplifier 05 in the first bank BANK0 and the sense amplifier 105 in the second bank BANK1. Namely, the p-type MOS field effect transistor TrP0 is connected in series through the sense amplifier activation signal line 07 to the sense amplifier 05 and also connected in series through the sense amplifier activation signal line 107 to the sense amplifier 105. The sense amplifier activation signal line 07 is provided for transmission of a sense amplifier activation signal SAP0 from the sense amplifier driver circuit 03 to the sense amplifier 05. The sense amplifier activation signal line 07 is provided for transmission of a sense amplifier activation signal SAP1 from the sense amplifier driver circuit 103 to the sense amplifier 105. A gate electrode of the p-type MOS field effect transistor TrP0 is connected to a second control signal line for receipt of a control signal ▓▓▓▓ which is inversion signal to the control signal CSA to be applied to the gate of the n-type MOS field effect transistor TrN0. When it is required to read out data from memory cells on a currently selected word line different from the previously selected word line, then the control signal ▨▨▨ is set low level and applied to the gate electrode of the p-type MOS field effect transistor TrP0 whereby the p-type MOS field effect transistor TrP0 turns ON to make the sense amplifier 05 in the first bank BANK0 electrically conductive to the sense amplifier 105 in the second bank BANK1. As a result, the charges are supplied from the sense amplifier 105 in the second bank BANK1 to the sense amplifier 05 in the first bank BANK0 to activate the sense amplifier 05 at high speed.

The activation of the sense amplifier 05 in the currently selected bank BANK0 is made not only by driving the sense amplifier driver circuit 03 but also upon receipt of charges from the sense amplifier 105 in the previously selected bank BANK1. Namely, in order to activate the sense amplifier 05 in the currently selected bank BANK0, the above sense amplifier activation signal line connection control circuit 200 makes the sense amplifier 05 in the currently selected bank BANK0 electrically conductive to the sense amplifier 105 in the previously selected bank BANK1 so that the charges acting as the sense amplifier activation signal is supplied from the sense amplifier 105 in the previously selected bank BANK1 through the sense amplifier activation signal lines 107 and 108, the sense amplifier activation signal line connection control circuit 200 and the sense amplifier activation signal lines 07 and 08 into the sense amplifier 05 in the currently selected bank BANK0. Upon receipt of the charges acting as the sense amplifier activation signal, the activation of the sense amplifier 05 in the currently selected bank BANK0 is promoted and accelerated so as to increase the activation speed.

The sense amplifier activation signal line connection control circuit 201 may also comprise n-type and p-type MOS field effect transistors TrN1 and TrP1. The n-type MOS field effect transistor TrN1 is provided between the sense amplifier 06 in the first bank BANK0 and the sense amplifier 106 in the second bank BANK1. Namely, the n-type MOS field effect transistor TrN1 is connected in series through the sense amplifier activation signal line 10 to the sense amplifier 06 and also connected in series through the sense amplifier activation signal line 110 to the sense amplifier 106. The sense amplifier activation signal line 10 is provided for transmission of a sense amplifier activation signal SAN0 from the sense amplifier driver circuit 04 to the sense amplifier 06. The sense amplifier activation signal line 110 is provided for transmission of a sense amplifier activation signal SAN1 from the sense amplifier driver circuit 104 to the sense amplifier 106. A gate electrode of the n-type MOS field effect transistor TrN1 is connected to a first control signal line for receipt of a control signal CSA. When it is required to read out data from memory cells on a currently selected word line different from the previously selected word line, then the control signal CSA is set high level and applied to the gate electrode of the n-type MOS field effect transistor TrN0 whereby the n-type MOS field effect transistor TrN1 turns ON to make the sense amplifier 06 in the first bank BANK0 electrically conductive to the sense amplifier 106 in the second bank BANK1. As a result, the charges are supplied from the sense amplifier 106 in the second bank BANK1 to the sense amplifier 06 in the first bank BANK0 to activate the sense amplifier 06 at high speed.

The p-type MOS field effect transistor TrP1 is provided between the sense amplifier 06 in the first bank BANK0 and the sense amplifier 106 in the second bank BANK1. Namely, the p-type MOS field effect transistor TrP1 is connected in series through the sense amplifier activation signal line 09 to the sense amplifier 06 and also connected in series through the sense amplifier activation signal line 109 to the sense amplifier 106. The sense amplifier activation signal line 09 is provided for transmission of a sense amplifier activation signal SAP0 from the sense amplifier driver circuit 04 to the sense amplifier 06. The sense amplifier activation signal line 109 is provided for transmission of a sense amplifier activation signal SAP1 from the sense amplifier driver circuit 104 to the sense amplifier 106. A gate electrode of the p-type MOS field effect transistor TrP1 is connected to a second control signal line for receipt of a control signal ▨▨▨ which is inversion signal to the control signal CSA to be applied to the gate of the n-type MOS field effect transistor TrN1. When it is required to read out data from memory cells on a currently selected word line different from the previously selected word line, then the control signal ▨▨▨ is set low level and applied to the gate electrode of the p-type MOS field effect transistor TrP1 whereby the p-type MOS field effect transistor TrP1 turns ON to make the sense amplifier 06 in the first bank BANK0 electrically conductive to the sense amplifier 106 in the second bank BANK1. As a result, the charges are supplied from the sense amplifier 106 in the second bank BANK1 to the sense amplifier 06 in the first bank BANK0 to activate the sense amplifier 06 at high speed.

The activation of the sense amplifier 06 in the currently selected bank BANK0 is made not only by driving the sense amplifier driver circuit 04 but also upon receipt of charges from the sense amplifier 106 in the previously selected bank BANK1. Namely, in order to activate the sense amplifier 06 in the currently selected bank BANK0, the above sense amplifier activation signal line connection control circuit 201 makes the sense amplifier 06 in the currently selected bank BANK0 electrically conductive to the sense amplifier 106 in the previously selected bank BANK1 so that the charges acting as the sense amplifier activation signal is supplied from the sense amplifier 106 in the previously selected bank BANK1 through the sense amplifier activation signal lines 109 and 110, the sense amplifier activation signal line connection control circuit 201 and the sense amplifier activation signal lines 09 and 10 into the sense amplifier 06 in the currently selected bank BANK0. Upon receipt of the charges acting as the sense amplifier activation signal, the activation of the sense amplifier 06 in the currently selected bank BANK0 is promoted and accelerated so as to increase the activation speed.

During when the bank is kept in the state of the sense amplifier activation where it is possible to activate any of the sense amplifiers, the above control signal CSA and its inversion signal ▨▨▨ may be continued to be applied to the gate electrodes of the n-type and p-type transistors in the form of the sense amplifier activation signal line connection control circuit 200 or 201.

Figure 4:
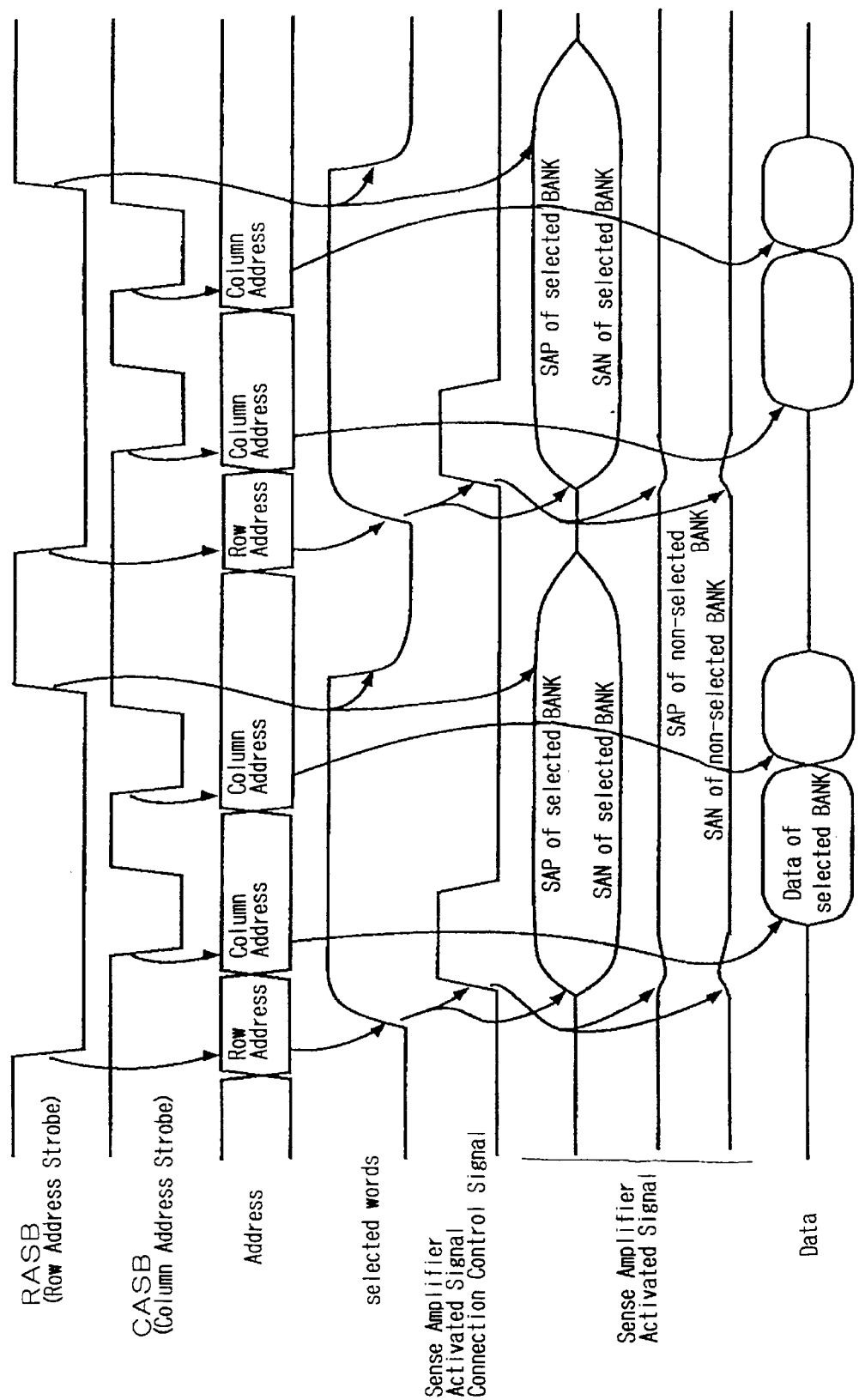
FIG. 4 is a diagram illustrative of waveforms of signals transmitted for reading out data from a novel dynamic random access memory device comprising two banks of FIG. 3.
Figure 7:
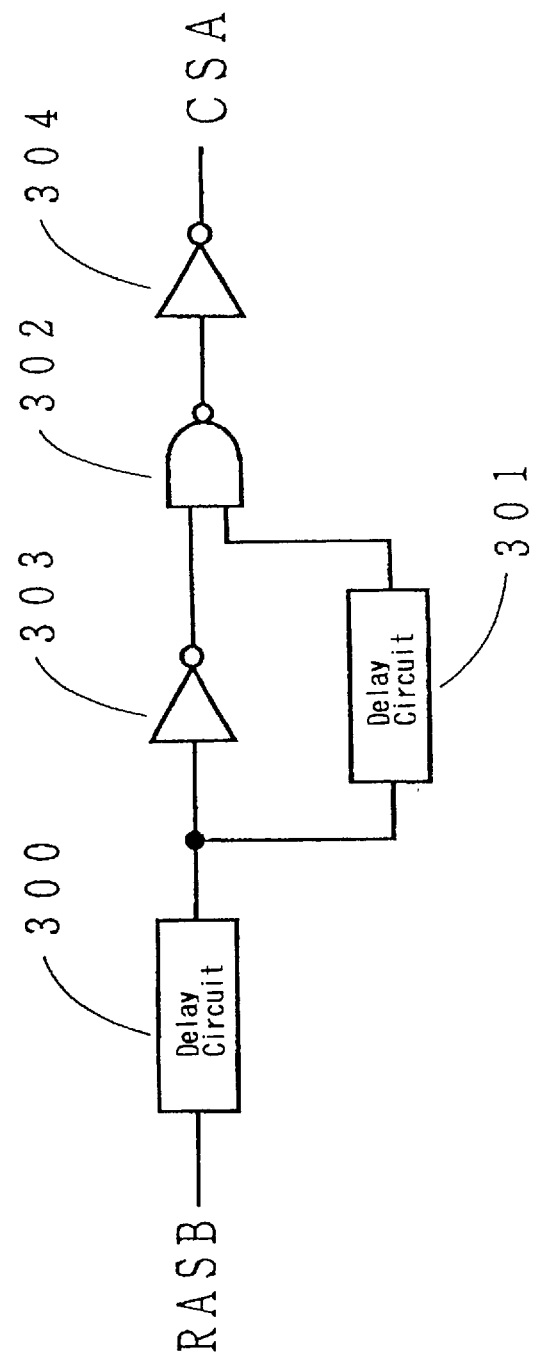
FIG. 7 is a circuit diagram illustrative of a control circuit for controlling operations of a sense amplifier activation signal line connection control circuit provided between sense amplifiers respectively provided in two banks of a novel dynamic random access memory device in a preferred embodiment according to the present invention.

Alternatively, the above control signal CSA and its inversion signal ▨▨▨ may be one-shot signals to be applied in a moment of the time-duration when the bank is kept in the state of the sense amplifier activation where it is possible to activate any of the sense amplifiers. FIG. 4 is a diagram illustrative of waveforms of signals transmitted for reading out data from the dynamic random access memory device where the above one-shot control signal CSA and its inversion signal ▨▨▨ are applied to the n-type and p-type MOS field effect transistors. The one-shot control signal CSA and its inversion signal ▨▨▨ may be generated by use of a one-shot control signal generation circuit as shown in FIG. 7. The one-shot control signal generation circuit comprises the following circuit elements. A first delay circuit 300 is provided which receives input of the row address strobe signal RASB. A first invertor 303 is also provided which has an input terminal connected to an output of the above first delay circuit 300 for receiving the delayed row address strobe signal from the first delay circuit 300 and inversion of the delayed row address strobe signal. A second delay circuit 301 is also provided which has an input terminal connected to the output of the above first delay circuit 300 so that the second delay circuit 301 is connected in parallel to the first invertor 303. The second delay circuit 301 receives the delayed row address strobe signal from the first delay circuit 300 and further delaying the received signal. A NAND gate 302 is further provided which has two input terminals where first one is connected to an output of the first invertor 303 and second one is connected to an output of the second delay circuit 301. The NAND gate 302 receives the inverted signal from the first invertor 303 and the delayed signal from the second delay circuit 301. A second invertor 304 is furthermore provided which has an input terminal connected to an output of the NAND gate 302. The second invertor 304 receives the output signal from the NAND gate 302 and inverted NAND gate 302 and inverted the received signal to output the one-shot control signal CSA.

Figure 6:
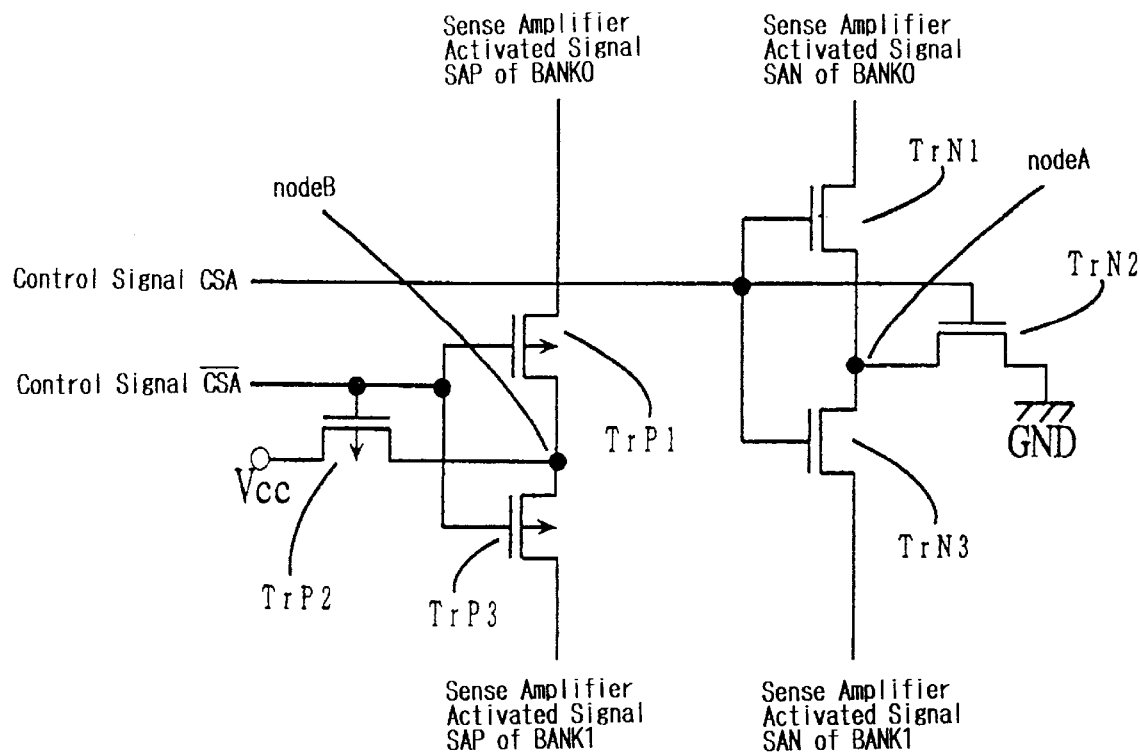
FIG. 6 is a circuit diagram illustrative of another sense amplifier activation signal line connection control circuit provided between sense amplifiers respectively provided in two banks of a novel dynamic random access memory device in a preferred embodiment according to the present invention.

Further, the above sense amplifier activation signal line connection control circuit may alternatively comprise another circuitry shown in FIG. 6. The sense amplifier activation signal line connection control circuit 200 includes a series connection of n-type MOS field effect transistors TrN1 and TrN3 between the sense amplifier activation signal line 08 connected with the sense amplifier 05 in the first bank BANK0 and the sense amplifier activation signal line 108 connected with the sense amplifier 105 in the second bank BANK1. The n-type MOS field effect transistor TrN1 is directly connected with the sense amplifier activation signal line 08 in the first bank BANK0 whilst the n-type MOS field effect transistor TrN3 is directly connected with the sense amplifier activation signal line 108 in the second bank BANK1. A control signal line for transmitting a control signal CSA is commonly connected to gate electrodes of the n-type MOS field effect transistors TrN1 and TrN3 connected in series between the sense amplifier activation signal line 08 in the first bank BANK0 and the sense amplifier activation signal line 108 in the second bank BANK1 so that the gate electrodes of the n-type MOS field effect transistors TrN1 and TrN3 commonly receive the control signal CSA. When it is required to read out data from memory cells on a currently selected word line different from the previously selected word line, then the control signal CSA is set high level and applied to the gate electrode of the n-type MOS field effect transistors TrN1 and TrN3 whereby the n-type MOS field effect transistors TrN1 and TrN3 turn ON to make the sense amplifier 05 in the first bank BANK0 electrically conductive to the sense amplifier 105 in the second bank BANK1. An n-type MOS field effect transistor TrN2 is further provided which is connected in series between a ground line GND and a node "A" positioned in an intermediate of the n-type MOS field effect transistors TrN1 and TrN3. A gate of the a-type MOS field effect transistor TrN2 is connected to the control signal line for transmitting the control signal CSA so that the gate electrodes of the n-type MOS field effect transistor TrN2 receives the control signal CSA. When it is required to read out data from memory cells on a currently selected word line different from the previously selected word line, then the control signal CSA is set high level and applied to the gate electrode of the n-type MOS field effect transistor TrN2 whereby the n-type MOS field effect transistor TrN2 turns ON to make the node "A" electrically conductive to the ground line GND and the potential of the node "A" is dropped to the ground level.

The sense amplifier activation signal line connection control circuit 200 also includes a series connection of p-type MOS field effect transistors TrP1 and TrP3 between the sense amplifier activation signal line 07 connected with the sense amplifier 05 in the first bank BANK0 and the sense amplifier activation signal line 107 connected with the sense amplifier 105 in the second bank BANK1. The p-type MOS field effect transistor TrP1 is directly connected with the sense amplifier activation signal line 07 in the first bank BANK0 whilst the p-type MOS field effect transistor TrP3 is directly connected with the sense amplifier activation signal line 107 in the second bank BANK1. A control signal line for transmitting an inversion control signal $\overline{CSA}$ as an inversion signal to the control signal CSA is commonly connected to gate electrodes of the p-type MOS field effect transistors TrP1 and TrP3 connected in series between the sense amplifier activation signal line 07 in the first bank BANK0 and the sense amplifier activation signal line 107 in the second bank BANK1 so that the gate electrodes of the p-type MOS field effect transistors TrP1 and TrP3 commonly receive the inversion control signal $\overline{CSA}$. When it is required to read out data from memory cells on a currently selected word line different from the previously selected word line, then the inversion control signal $\overline{CSA}$ is set low level and applied to the gate electrode of the p-type MOS field effect transistors TrP1 and TrP3 whereby the p-type MOS field effect transistors TrP1 and TrP3 turn ON to make the sense amplifier 05 in the first bank BANK0 electrically conductive to the sense amplifier 105 in the second bank BANK1. A p-type MOS field effect transistor TrP2 is further provided which is connected in series between a high voltage line Vcc and a node "B" positioned in an intermediate of the p-type MOS field effect transistors TrP1 and TrP3. A gate of the p-type MOS field effect transistor TrP2 is connected to the control signal line for transmitting the inversion control signal $\overline{CSA}$ so that the gate electrodes of the p-type MOS field effect transistor TrP2 receives the inversion control signal $\overline{CSA}$. When it is required to read out data from memory cells on a currently selected word line different from the previously selected word line, then the inversion control signal $\overline{CSA}$ is set low level and applied to the gate electrode of the p-type MOS field effect transistor TrP2 whereby the p-type MOS field effect transistor TrP2 turns ON to make the node "B" electrically conductive to the high voltage line Vcc and the potential of the node "B" is risen up to the high voltage.

When it is required to read out data from memory cells on a currently selected word line different from the previously selected word line, then the control signal CSA is set high level and applied to the gate electrode of the n-type MOS field effect transistors TrN1 and TrN3 as well as the inversion control signal $\overline{CSA}$ is set low level and applied to the gate electrode of the p-type MOS field effect transistors TrP1 and TrP3 whereby the n-type MOS field effect transistors TrN1 and TrN3 turn ON to make the sense amplifier 05 in the first bank BANK0 electrically conductive to the sense amplifier 105 in the second bank BANK1 as well as the p-type MOS field effect transistors TrP1 and TrP3 turn ON to make the sense amplifier 05 in the first bank BANK0 electrically conductive to the sense amplifier 105 in the second bank BANK1. The activation of the sense amplifier 05 in the currently selected bank BANK0 is made not only by driving the sense amplifier driver circuit 03 but also upon receipt of charges from the sense amplifier 105 in the previously selected bank BANK1. Namely, in order to activate the sense amplifier 05 in the currently selected bank BANK0, the above sense amplifier activation signal line connection control circuit 200 makes the sense amplifier 05 in the currently selected bank BANK0 electrically conductive to the sense amplifier 105 in the previously selected bank BANK1 so that the charges acting as the sense amplifier activation signal is supplied from the sense amplifier 105 in the previously selected bank BANK1 through the sense amplifier activation signal lines 107 and 108, the sense amplifier activation signal line connection control circuit 200 and the sense amplifier activation signal lines 07 and 08 into the sense amplifier 05 in the currently selected bank BANK0. Upon receipt of the charges acting as the sense amplifier activation signal, the activation of the sense amplifier 05 in the currently selected bank BANK0 is promoted and accelerated so as to increase the activation speed.

Furthermore, the sense amplifier activation signal line connection control circuit 201 also includes a series connection of n-type MOS field effect transistors TrN1 and TrN3 between the sense amplifier activation signal line 10 connected with the sense amplifier 06 in the first bank BANK0 and the sense amplifier activation signal line 110 connected with the sense amplifier 106 in the second bank BANK1. The n-type MOS field effect transistor TrN1 is directly connected with the sense amplifier activation signal line 10 in the first bank BANK0 whilst the n-type MOS field effect transistor TrN3 is directly connected with the sense amplifier activation signal line 110 in the second bank BANK1. A control signal line for transmitting a control signal CSA is commonly connected to gate electrodes of the n-type MOS Geld effect transistors TrN1 and TrN3 connected in series between the sense amplifier activation signal line 10 in the first bank BANK0 and the sense amplifier activation signal line 110 in the second bank BANK1 so that the gate electrodes of the n-type MOS field effect transistors TrN1 and TrN3 commonly receive the control signal CSA. When it is required to read out data from memory cells on a currently selected word line different from the previously selected word line, then the control signal CSA is set high level and applied to the gate electrode of the n-type MOS field effect transistors TrN1 and TrN3 whereby the n-type MOS field effect transistors TrN1 and TrN3 turn ON to make the sense amplifier 06 in the first bank BANK0 electrically conductive to the sense amplifier 106 in the second bank BANK1. An n-type MOS field effect transistor TrN2 is further provided which is connected in series between a ground line GND and a node "A" positioned in an intermediate of the n-type MOS field effect transistors TrN1 and TrN3. A gate of the n-type MOS field effect transistor TrN2 is connected to the control signal line for transmitting the control signal CSA so that the gate electrodes of the n-type MOS field effect transistor TrN2 receives the control signal CSA. When it is required to read out data from memory cells on a currently selected word line different from the previously selected word line then the control signal CSA is set high level and applied to the gate electrode of the n-type MOS field effect transistor TrN2 whereby the n-type MOS field effect transistor TrN2 turns ON to make the node "A" electrically conductive to the ground line GND and the potential of the node "A" is dropped to the ground level.

The sense amplifier activation signal line connection control circuit 201 also includes a series connection of p-type MOS field effect transistors TrP1 and TrP3 between the sense amplifier activation signal line 09 connected with the sense amplifier 06 in the first bank BANK0 and the sense amplifier activation signal line 109 connected with the sense amplifier 106 in the second bank BANK1. The p-type MOS field effect transistor TrP1 is directly connected with the sense amplifier activation signal line 09 in the first bank BANK0 whilst the p-type MOS field affect transistor TrP3 is directly connected with the sense amplifier activation signal line 109 in the second bank BANK1. A control signal line for transmitting an inversion control signal  as an inversion signal to the control signal CSA is commonly connected to gate electrodes of the p-type MOS field effect transistors TrP1 and TrP3 connected in series between the sense amplifier activation signal line 09 in the fist bank BANK0 and the sense amplifier activation signal line 109 in the second bank BANK1 so that the gate electrodes of the p-type MOS field effect transistors TrP1 and TrP3 commonly receive the inversion control signal . When it is required to read out data from memory cells on a currently selected word line different from the previously selected word line, then the inversion control signal  is set low level and applied to the gate electrode of the p-type MOS field effect transistors TrP1 and TrP3 whereby the p-type MOS field effect transistors TrP1 and TrP3 turn ON to make the sense amplifier 06 in the first bank BANK0 electrically conductive to the sense amplifier 106 in the second bank BANK1. A p-type MOS field effect transistor TrP2 is further provided which is connected in series between a high voltage line Vcc and a node "B" positioned in an intermediate of the p-type MOS field effect transistors TrP1 and TrP3. A gate of the p-type MOS field effect transistor TrP2 is connected to the control signal line for transmitting the inversion control signal  so that the gate electrodes of the p-type MOS field effect transistor TrP2 receives the inversion control signal . When it is required to read out data from memory cells on a currently selected word line different from the previously selected word line, then the inversion control signal  is set low level and applied to the gate electrode of the p-type MOS field effect transistor TrP2 whereby the p-type MOS field effect transistor TrP2 turns ON to make the node "B" electrically conductive to the high voltage line Vcc and the potential of the node "B" is risen up to the high voltage.

when it is required to read out data from memory cells on a currently selected word line different from the previously selected word line, then the control signal CSA is set high level and applied to the gate electrode of the n-type MOS field effect transistors TrN1 and TrN3 as well as the inversion control signal  is set low level and applied to the gate electrode of the p-type MOS field effect transistors TrP1 and TrP3 whereby the n-type MOS field effect transistors TrN1 and TrN3 turn ON to make the sense amplifier 06 in the first bank BANK0 electrically conductive to the sense amplifier 106 in the second bank BANK1 as well as the p-type MOS field effect transistors TrP1 and TrP3 turn ON to make the sense amplifier 06 in the first bank BANK0 electrically conductive to the sense amplifier 106 in the second bank BANK1. The activation of the sense amplifier 06 in the currently selected bank BANK0 is made not only by driving the sense amplifier driver circuit 04 but also upon receipt of charges from the sense amplifier 106 in the previously selected bank BANK1. Namely, in order to activate the sense amplifier 06 in the currently selected bank BANK0, the above sense amplifier activation signal line connection control circuit 201 makes the sense amplifier 06 in the currently selected bank BANK0 electrically conductive to the sense amplifier 106 in the previously selected bank BANK1 so that the charges acting as the sense amplifier activation signal is supplied from the sense amplifier 106 in the previously selected bank BANK1 through the sense amplifier activation signal lines 109 and 110, the sense amplifier activation signal line connection control circuit 201 and the sense amplifier activation signal lines 09 and 10 into the sense amplifier 06 in the currently selected bank BANK0. Upon receipt of the charges acting as the sense amplifier activation signal, the activation of the sense amplifier 06 in the currently selected bank BANK0 is promoted and accelerated so as to increase the activation speed.

During when the bank is kept in the state of the sense amplifier activation where it is possible to activate any of the sense amplifiers, the above control signal CSA and its inversion signal ▓▓▓▓ may be continued to be applied to the gate electrodes of the n-type and p-type transistors in the form of the sense amplifier activation signal line connection control circuit 200 or 201.

Alternatively, the above control signal CSA and its inversion signal ▓▓▓▓ may be one-shot signals lo be applied in a moment of the time-duration when the bank is kept in the state of the sense amplifier activation where it is possible to activate any of the sense amplifiers. FIG. 4 is a diagram illustrative of waveforms of signals transmitted for reading out data from the dynamic random access memory device where the above one-shot control signal CSA and its inversion signal ▓▓▓▓ are applied to the n-type and p-type MOS field effect transistors. The one-shot control signal CSA and its inversion signal ▓▓▓▓ may be generated by use of a one-shot control signal generation circuit as shown in FIG. 7. The one-shot control signal generation circuit comprises the following circuit elements. A first delay circuit 300 is provided which receives input of the row address strobe signal RASB. A first invertor 303 is also provided which has an input terminal connected to an output of the above first delay circuit 300 for receiving the delayed row address strobe signal from the first delay circuit 300 and inversion of the delayed row address strobe signal. A second delay circuit 301 is also provided which has an input terminal connected to the output of the above first delay circuit 300 so that the second delay circuit 301 is connected in parallel to the first invertor 303. The second delay circuit 301 receives the delayed row address strobe signal from the first delay circuit 300 and further delaying the received signal. A NAND gate 302 is further provided which has two input terminals where first one is connected to an output of the fist invertor 303 and second one is connected to an output of the second delay circuit 301. The NAND gate 302 receives the inverted signal from the first invertor 303 and the delayed signal from the second delay circuit 301. A second invertor 304 is furthermore provided which has an input terminal connected to an output of the NAND gate 302. The second invertor 304 receives the output signal from the NAND gate 302 and inverted the received signal to output the one-shot control signal CSA.

In the above embodiment, the dynamic random access memory comprises two banks BANK0 and BANK1, the prevent invention may be applicable to the other dynamic random access memory comprises a plurality of banks, for example, three or four banks.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A connection control circuit for providing an electrical connection between a pair of sense amplifiers respectively provided in adjacent two banks in a dynamic random access memory device having a plurality of said banks, each of said sense amplifiers being connected to a sense amplifier driver circuit for supplying a sense amplifier activation signal to said sense amplifier so as to activate said sense amplifier, wherein said connection control circuit operates to make said paired sense amplifiers electrically conductive to each other so that charges are supplied from first one of said paired sense amplifiers through said connection control circuit to second one of said paired sense amplifiers whereby said second one of said paired sense amplifiers is activated not only by said sense amplifier driver circuit but also with said charges supplied through said connection control circuit from said first one of said paired sense amplifiers, provided that said connection control circuit connects said pair of said sense amplifiers when said bank having said first one of said paired sense amplifiers has been previously selected and said bank having said second one of said paired sense amplifiers is currently selected.

2. The connection control circuit as claimed in claim 1, wherein said first one of said sense amplifiers is connected to first one of said sense amplifier driver circuits through first and second sense amplifier activation signal lines which transmit first and second sense amplifier activation signals respectively, and said second one of said sense amplifiers is connected to second one of said sense amplifier driver circuits through third and fourth sense amplifier activation signal lines which transmit third and fourth sense amplifier activation signals respectively, and wherein said connection control circuit comprises:

a first switching circuit being capable of connecting said first and third sense amplifier activation signal lines and also being connected to a first connection control signal line for receiving a first connection control signal having been transmitted on said first connection control signal line so that said first switching circuit operates to connect said first and third sense amplifier activation signal lines in accordance with said first connection control signal, and a second switching circuit being capable of connecting said second and fourth sense amplifier activation signal lines and also being connected to a second connection control signal line for receiving a second connection control signal having been transmitted on said second connection control signal line so that said second switching circuit operates to connect said second and fourth sense amplifier activation signal lines in accordance with said second connection control signal.

3. The connection control circuit as claimed in claim 2, wherein said first switching circuit comprises a first conductivity type channel field effect transistor connected in series between said first and third sense amplifier activation signal lines and said first conductivity type channel field effect transistor having a gate electrode connected to said first connection control signal line; and wherein said second switching circuit comprises a second conductivity type channel field effect transistor connected in series between said second and fourth sense amplifier activation signal lines and said second conductivity type channel field effect transistor having a gate electrode connected to said second connection control signal line, provided that said second connection control signal being transmitting on said second connection control signal line is an inversion signal to said first connection control signal being transmitting on said first connection control signal line.

4. The connection control circuit as claimed in claim 2, wherein said first switching circuit comprises:
- a series connection of first and second field effect transistors of a first conductivity type channel between said first and third sense amplifier activation signal lines and said first and second field effect transistors having gate electrodes commonly connected to said first connection control signal line; and
- a third field effect transistor of said first conductivity type channel connected in series between a ground line and a first node positioned between said first and second field effect transistors and said third field effect transistor having a gate electrode connected to said first connection control signal line, and wherein said second switching circuit comprises:
- a series connection of fourth and fifth field effect transistors of a second conductivity type channel between said second and fourth sense amplifier activation signal lines and said fourth and fifth field effect transistors having gate electrodes commonly connected to said second connection control signal line, and
- a sixth field effect transistor of said second conductivity type channel connected in series between a high voltage line and a second node positioned between said fourth and fifth field effect transistors and said sixth field effect transistor having a gate electrode connected to said second connection control signal line, provided that said second connection control signal being transmitting on said second connection control signal line is an inversion signal to said first connection control signal being transmitting on said first connection control signal line.

5. The connection control circuit as claimed in claim 2, wherein said first and second connection control signal lines are kept to be applied to said first and second switching circuits during when any one of said banks is kept in a sense amplifier activation state where it is possible to activate said sense amplifiers.

6. The connection control circuit as claimed in claim 2, wherein said first and second connection control signal lines are one-shot signals applied to said first and second switching circuits in a moment of the time-duration when any one of said banks is kept in a sense amplifier activation state where it is possible to activate said sense amplifiers.

7. A dynamic random access memory device comprising a plurality of banks, each of said banks including a plurality of memory cell arrays, each of said memory cell arrays being connected to a row address decoder and a sense amplifier which is connected to a sense amplifier driver circuit for supplying a sense amplifier activation signal to said sense amplifier so as to activate said sense amplifier,
wherein a pair of said sense amplifiers respectively provided in adjacent two banks has a connection control circuit which is capable of providing an electrical connection between said paired sense amplifiers respectively provided in said adjacent two banks, and
wherein said connection control circuit operates to make said paired sense amplifiers electrically conductive to each other so that charges are supplied from first one of said paired sense amplifiers through said connection control circuit to second one of said paired sense amplifiers whereby said second one of said paired sense amplifiers is activated not only by said sense amplifier driver circuit but also with said charges supplied through said connection control circuit from said first one of said paired sense amplifiers, provided that said connection control circuit connects said pair of said sense amplifiers when said bank having said first one of said paired sense amplifiers has been previously selected and said bank having said second one of said paired sense amplifiers is currently selected.

8. The dynamic random access memory device as claimed in claim 7,
wherein said first one of said sense amplifiers is connected to first one of said sense amplifier driver circuits through first and second sense amplifier activation signal lines which transmit first and second sense amplifier activation signals respectively, and said second one of said sense amplifiers is connected to second one of said sense amplifier driver circuits through third and fourth sense amplifier activation signal lines which transmit third and fourth sense amplifier activation signals respectively, and
wherein said connection control circuit comprises:
- a first switching circuit being capable of connecting said first and third sense amplifier activation signal lines and also being connected to a first connection control signal line for receiving a first connection control signal having been transmitted on said first connection control signal line so that said first switching circuit operates to connect said first and third sense amplifier activation signal lines in accordance with said first connection control signal, and
- a second switching circuit being capable of connecting said second and fourth sense amplifier activation signal lines and also being connected to a second connection control signal line for receiving a second connection control signal having been transmitted on said second connection control signal line so that said second switching circuit operates to connect said second and fourth sense amplifier activation signal lines in accordance with said second connection control signal.

9. The dynamic random access memory, device as claimed in claim 8,
wherein said first switching circuit comprises a first conductivity type channel field effect transistor connected in series between said first and third sense amplifier activation signal lines and said first conductivity type channel field effect transistor having a gate electrode connected to said first connection control signal line, and
wherein said second switching circuit comprises a second conductivity type channel field effect transistor connected in series between said second and fourth sense amplifier activation signal lines and said second conductivity type channel field effect transistor having a gate electrode connected to said second connection control signal line, provided that said second connection control signal being transmitting on said second connection control signal line is an inversion signal to said first connection control signal being transmitting on said fit connection control signal line.

10. The dynamic random access memory device as claimed in claim 8,
wherein said first switching circuit comprises:
- a series connection of first and second field effect transistors of a first conductivity type channel between said first and third sense amplifier activation signal lines and said first and second field effect transistors having gate electrodes commonly connected to said first connection control signal line; and a third field effect transistor of said first conductivity type channel connected in series between a ground line and a first node positioned between said first and second field effect transistors and said third field effect transistor having a gate electrode connected to said first connection control signal line, and wherein said second switching circuit comprises:
- a series connection of fourth and fifth field effect transistors of a second conductivity type channel between said second and fourth sense amplifier activation signal lines and said fourth and fifth field effect transistors having gate electrodes commonly connected to said second connection control signal line; and
- a sixth field effect transistor of said second conductivity type channel connected in series between a high voltage line and a second node positioned between said fourth and fifth field effect transistors and said sixth field effect transistor having a gate electrode connected to said second connection control signal line, provided that said second connection control signal being transmitting on said second connection control signal line is an inversion signal to said first connection control signal being transmitting on said first connection control signal line.

11. The dynamic random access memory device as claimed in claim 8, wherein said first and second connection control signal lines are kept to be applied to said first and second switching circuits during when any one of said banks is kept in a sense amplifier activation state where it is possible to activate said sense amplifiers.

12. The dynamic random access memory device as claimed in claim 8, wherein said first and second connection control signal lines are one-shot signals applied to said first and second switching circuits in a moment of the time-duration when any one of said banks is kept in a sense amplifier activation state where it is possible to activate said sense amplifiers.

* * * * *